(12) United States Patent
Kimura et al.

(10) Patent No.: US 6,488,864 B2
(45) Date of Patent: Dec. 3, 2002

(54) PIEZOELECTRIC CERAMIC COMPACT AND PIEZOELECTRIC CERAMIC DEVICE

(75) Inventors: Masahiko Kimura, Kusatsu (JP); Takuya Sawada, Moriyama (JP); Akira Ando, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/860,424

(22) Filed: May 18, 2001

(65) Prior Publication Data

US 2002/0011585 A1 Jan. 31, 2002

(30) Foreign Application Priority Data

May 18, 2000 (JP) ........................................ 2000-146654

(51) Int. Cl.⁷ ...................... C04B 34/453; C04B 35/495
(52) U.S. Cl. ................... 252/62.9 R; 501/134; 501/135
(58) Field of Search ...................... 252/62.9 R; 501/134, 501/135

(56) References Cited

U.S. PATENT DOCUMENTS 6,143,679 A * 11/2000 Nagasawa et al. .......... 423/596
6,197,600 B1 * 3/2001 Kijima et al. ............... 438/240

FOREIGN PATENT DOCUMENTS

GB            2353524       *  2/2001

OTHER PUBLICATIONS

English abstract of JP2000264732A, Sep. 2000.*
English abstract of JP02001127582A, May 2001.*
English abstract of JP02001160732A, Jun. 2001.*
"Preparation of Bi–Based Ferroelectric Thin Films by Sol–Gel Method"; Tsutomu Atsuki, et al.; *Jpn. J. Appl. Phys.*; vol. 34 (1995); pp. 5096–5099. No month.

* cited by examiner

*Primary Examiner*—Elizabeth D. Wood
(74) *Attorney, Agent, or Firm*—Dickstein, Shapiro, Morin & Oshinsky, LLP.

(57) ABSTRACT

A piezoelectric ceramic compact is provided as an effective material for forming piezoelectric ceramic devices and the like, and is primarily composed $SrBi_2Nb_2O_9$ containing no lead nor lead compounds or containing a little amount thereof, and has a maximum value $Q_{max}$ improved to a level suitable for practical use. In the piezoelectric ceramic compact primarily having a bismuth-based layered compound containing Sr, Bi, Nb and oxygen, when the molar ratio of Sr, Bi and Nb contained as primary components in the bismuth-based layered compound is represented by a: b: c, the relationships represented by $0.275 \leq a/c < 0.5$ and $4 \leq (2a+3b)/c \leq 4.5$ are satisfied.

16 Claims, 1 Drawing Sheet

PIEZOELECTRIC CERAMIC COMPACT AND PIEZOELECTRIC CERAMIC DEVICE

BACKGROUND OF THE INVENTION

1. Field of the Invention

The present invention relates to piezoelectric ceramics and piezoelectric ceramic devices using the same, and more particularly, relates to a piezoelectric ceramic compact as an effective material for forming piezoelectric ceramic devices, such as a piezoelectric ceramic filter, piezoelectric ceramic oscillator and piezoelectric ceramic vibrator, and to a piezoelectric ceramic device using the same.

2. Description of the Related Art

Conventionally, a piezoelectric ceramic compact primarily composed of lead titanate zirconate ($Pb(Ti_xZr_{1-x})O_3$) or lead titanate ($PbTiO_3$) has been widely used as a piezoelectric ceramic compact used for piezoelectric ceramic devices, such as a piezoelectric ceramic filter, piezoelectric ceramic oscillator and piezoelectric ceramic vibrator. However, since a considerable amount of lead is contained in the piezoelectric ceramic compact primarily composed of lead titanate zirconate or lead titanate, there has been a problem in that the uniformity is degraded due to the evaporation of the lead oxide during the manufacturing process. In order to avoid this problem, a piezoelectric ceramic compact containing no lead or containing a little amount thereof is preferably used.

Since a piezoelectric ceramic compact primarily composed of a bismuth-based layered compound, such as $SrBi_2Nb_2O_9$, contains no lead oxide, the problem described above does not occur.

In general, a material used for piezoelectric ceramic devices, in particular, for a piezoelectric ceramic oscillator or the like, preferably has a large maximum value ($Q_{max}$) of an electrical quality factor Q ($1/\tan \delta$) in the bandwidth, i.e., in the range from the resonant frequency to the antiresonant frequency. However, a piezoelectric ceramic compact primarily composed of a bismuth-based layered compound, such as $SrBi_2Nb_2O_9$, has a problem in that a maximum value $Q_{max}$ which is sufficiently large for practical use cannot be obtained.

SUMMARY OF THE INVENTION

Accordingly, an object of the present invention is to provide a piezoelectric ceramic compact as an effective material for forming a piezoelectric ceramic device and the like, which is primarily composed of $SrBi_2Nb_2O_9$ containing no lead nor lead compounds or containing a little amount thereof, and has a maximum value $Q_{max}$ improved to a level suitable for practical use. In addition, the present invention provides a piezoelectric ceramic device using the piezoelectric ceramic compact described above.

According to the present invention, in a piezoelectric ceramic compact primarily comprising a bismuth-based layered compound containing Sr, Bi, Nb and oxygen, when the molar ratio of Sr, Bi and Nb contained as primary components in the bismuth-based layered compound is represented by a: b : c, the relationships represented by $0.275 \leq a/c < 0.5$ and $4 \leq (2a+3b)/c \leq 4.5$ are satisfied.

The piezoelectric ceramic compact according to the present invention may further comprise a divalent metal element other than Sr or a trivalent metal element other than Bi in the range of from more than zero to about 0.1 mol with respect to 1 mol of Nb which is one of the primary components. The divalent metal element other than Sr contained in the piezoelectric ceramic compact is preferably at least one element selected from the group consisting of Mg, Ca, Ba and Pb. In addition, the trivalent metal element other than Bi contained in the piezoelectric ceramic compact is preferably at least one element selected from the group consisting of Sc, Y, La, Ce, Pr, Nd, Sm, Gd, Dy, Er and Yb.

The piezoelectric ceramic compact according to the present invention may further comprise Ta in the range of from more than zero to less than about 0.25 mol with respect to 1 mol of Nb of the primary components.

In addition, the piezoelectric ceramic compact according to the present invention may further comprise Mn in the range of from more than zero to about 1.5 percent by weight as $MnCO_3$.

A piezoelectric ceramic device according to the present invention comprises the piezoelectric ceramic compact of the present invention and electrodes provided for the piezoelectric ceramic compact.

In this connection, the piezoelectric ceramic compact of the present invention is a sintered material formed by firing a starting composition for the piezoelectric ceramic compact; however, hardly any change in the composition ratio described above is observed before and after firing.

According to the present invention, in the piezoelectric ceramic compact primarily comprising a bismuth-based layered compound containing Sr, Bi, Nb, and oxygen, when the molar ratio of Sr, Bi and Nb contained as primary components in the bismuth-based layered compound is represented by a: b: c, the relationships of the molar ratio are determined such that $0.275 \leq a/c < 0.5$ and $4 \leq (2a+3b)/c \leq 4.5$. The reason for this is that $Q_{max}$ at a level suitable for practical use cannot be obtained when the composition is outside the relationships described above.

In addition, when the piezoelectric ceramic compact of the present invention further comprises a divalent metal element other than Sr or a trivalent metal element other than Bi in the range of from more than zero to about 0.1 mol with respect to 1 mol of Nb of the primary components, the advantage of the present invention becomes more significant. The reason the piezoelectric ceramic compact comprises a divalent metal element other than Sr or a trivalent metal element other than Bi in the range of from more than zero to about 0.1 mol with respect to 1 mol of Nb is that when the content thereof exceeds the range described above, the $Q_{max}$ tends to decrease compared to the case in which the metal element described above is not present.

In addition, when the piezoelectric ceramic compact of the present invention further comprises Ta in the range of from more than zero to less than about 0.25 mol with respect to 1 mol of Nb of the primary component, the advantage of the present invention becomes more significant. The reason the piezoelectric ceramic compact comprises Ta in the range of from more than zero to less than about 0.25 mol with respect to 1 mol of Nb is that when the content thereof exceeds the range described above, the $Q_{max}$ tends to decrease compared to the case in which Ta is not present.

Furthermore, when the piezoelectric ceramic compact of the present invention further comprises Mn in the range of from more than zero to about 1.5 percent by weight as $MnCO_3$, the advantage of the present invention becomes more significant. The reason the piezoelectric ceramic compact comprises Mn in the range of from more than zero to about 1.5 percent by weight as $MnCO_3$ is that when the content thereof exceeds the range described above, the $Q_{max}$ tends to decrease compared to the case in which Mn is not present.

The objects described above, further objects, features, and advantages of the present invention will become more apparent from the following detailed description of the embodiments.

DESCRIPTION OF THE PREFERRED EMBODIMENTS

EXAMPLE

Figure 1:
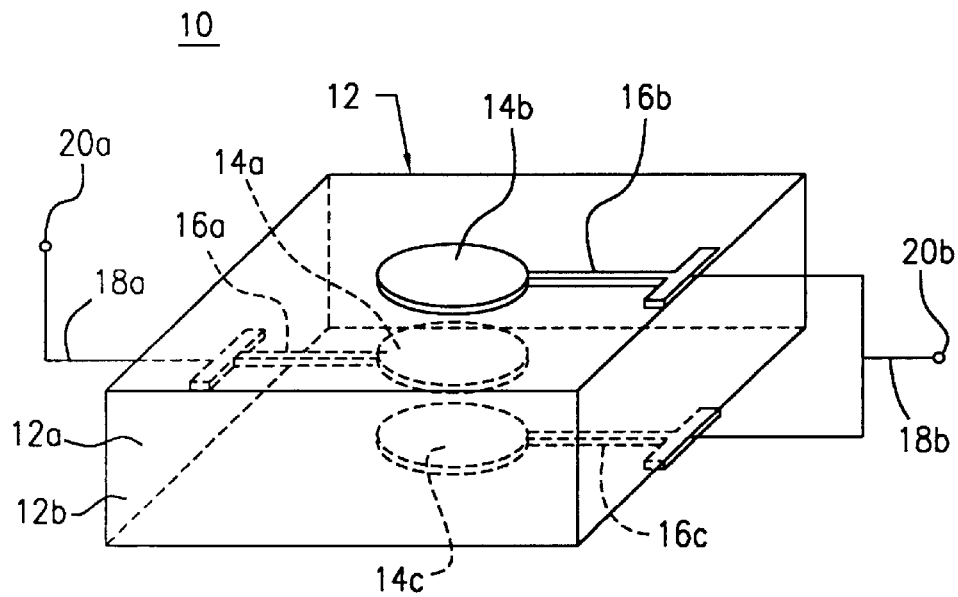
FIG. 1 is a perspective view showing an example of a piezoelectric ceramic vibrator according to the present invention.

As a starting material, $SrCO_3$, $Bi_2O_3$, $Nb_2O_5$, $CaCO_3$, $BaCO_3$, $La_2O_3$, $Nd_2O_3$, $Ta_2O_5$ and $MnCO_3$ were prepared and measured so as to have compositions represented by $(Sr_aBi_bNb_cO_9+x$ mol Me$+y$ mol Ta$+z$ wt % $MnCO_3)$ in which Me is Ca, Ba, Nd or La, and a, b, c, x, y and z were shown in Tables 1 and 2. The compositions thus prepared were wet-mixed for approximately 4 hours using a ball mill, thereby yielding mixtures. The mixtures were calcined at 700 to 900° C. after drying was performed, and as a result, calcined products were obtained. After the calcined products were coarsely pulverized, an appropriate amount of an organic binder was added to each product, wet pulverizing was then performed for 4 hours using a ball mill, and the particle distribution was subsequently controlled by passing the wet-pulverized products through 40 mesh sieve. Next, the products were molded at 1,000 kg/cm² so as to form disks 2 mm thick and 12.5 mm in diameter and were then fired at 1,000 to 1,300° C. in the air, whereby ceramics in the form of disks were formed. The two major surfaces of the ceramic were coated with a silver paste and were then baked, thereby forming silver electrodes. Next, a polarization treatment was performed by applying a DC voltage of 5 to 10 kV/mm to the ceramic for 10 to 30 minutes in an insulating oil at a temperature of 150 to 200° C., thereby yielding a piezoelectric ceramic compact (sample).

For all of the samples thus obtained, the fundamental wave of thickness extensional vibration mode, that is, the $Q_{max}$ of the fundamental wave of thickness extensional vibration mode of the disk-shape vibrator was measured. The results are shown in Tables 1 and 2.

TABLE 1

| Sample No. | a | b | c | Me | x | y | z | Firing Temperature (° C.) | $Q_{max}$ |
|---|---|---|---|---|---|---|---|---|---|
| 1* | 0.5 | 2.5 | 2.0 | — | 0 | 0 | 0 | 1100 | 8.3 |
| 2* | 0.55 | 2.2 | 2.0 | — | 0 | 0 | 0 | 1200 | 9.2 |
| 3 | 0.55 | 2.3 | 2.0 | — | 0 | 0 | 0 | 1150 | 15.2 |
| 4 | 0.55 | 2.6 | 2.0 | — | 0 | 0 | 0 | 1050 | 16.6 |
| 5* | 0.55 | 2.7 | 2.0 | — | 0 | 0 | 0 | 1050 | 9.4 |
| 6* | 0.6 | 2.2 | 2.0 | — | 0 | 0 | 0 | 1200 | 8.7 |
| 7 | 0.6 | 2.3 | 2.0 | — | 0 | 0 | 0 | 1150 | 16.2 |
| 8 | 0.6 | 2.6 | 2.0 | — | 0 | 0 | 0 | 1050 | 16.7 |
| 9* | 0.6 | 2.7 | 2.0 | — | 0 | 0 | 0 | 1050 | 9.2 |
| 10* | 0.8 | 2.1 | 2.0 | — | 0 | 0 | 0 | 1150 | 9.5 |
| 11 | 0.8 | 2.2 | 2.0 | — | 0 | 0 | 0 | 1100 | 18.8 |
| 12 | 0.8 | 2.4 | 2.0 | — | 0 | 0 | 0 | 1050 | 19.1 |
| 13* | 0.8 | 2.5 | 2.0 | — | 0 | 0 | 0 | 1050 | 9.5 |
| 14* | 1.0 | 2.0 | 2.0 | — | 0 | 0 | 0 | 1250 | 9.8 |
| 15* | 0.8 | 2.1 | 2.0 | Nd | 0.1 | 0 | 0 | 1150 | 9.7 |
| 16 | 0.8 | 2.2 | 2.0 | Nd | 0.1 | 0 | 0 | 1100 | 22.2 |
| 17 | 0.8 | 2.4 | 2.0 | Nd | 0.1 | 0 | 0 | 1050 | 23.1 |
| 18* | 0.8 | 2.5 | 2.0 | Nd | 0.1 | 0 | 0 | 1050 | 9.8 |
| 19* | 0.8 | 2.1 | 2.0 | Nd | 0.2 | 0 | 0 | 1150 | 9.4 |
| 20 | 0.8 | 2.2 | 2.0 | Nd | 0.2 | 0 | 0 | 1100 | 20.3 |
| 21 | 0.8 | 2.4 | 2.0 | Nd | 0.2 | 0 | 0 | 1050 | 20.6 |
| 22* | 0.8 | 2.5 | 2.0 | Nd | 0.2 | 0 | 0 | 1050 | 9.6 |
| 23* | 0.8 | 2.4 | 2.0 | Nd | 0.25 | 0 | 0 | 1200 | 7.8 |
| 24* | 0.8 | 2.1 | 2.0 | Ba | 0.1 | 0 | 0 | 1050 | 9.6 |
| 25 | 0.8 | 2.2 | 2.0 | Ba | 0.1 | 0 | 0 | 1150 | 22.0 |
| 26 | 0.8 | 2.4 | 2.0 | Ba | 0.1 | 0 | 0 | 1050 | 22.6 |
| 27* | 0.8 | 2.5 | 2.0 | Ba | 0.1 | 0 | 0 | 1200 | 9.5 |
| 28* | 0.8 | 2.1 | 2.0 | Ba | 0.2 | 0 | 0 | 1150 | 9.1 |
| 29 | 0.8 | 2.2 | 2.0 | Ba | 0.2 | 0 | 0 | 1050 | 19.4 |
| 30 | 0.8 | 2.4 | 2.0 | Ba | 0.2 | 0 | 0 | 1050 | 20.1 |

TABLE 2

| Sample No. | a | b | c | Me | x | y | z | Firing Temperature (° C.) | $Q_{max}$ |
|---|---|---|---|---|---|---|---|---|---|
| 31* | 0.8 | 2.5 | 2.0 | Ba | 0.2 | 0 | 0 | 1050 | 9.3 |
| 32* | 0.8 | 2.4 | 2.0 | Ba | 0.25 | 0 | 0 | 1200 | 7.2 |
| 33 | 0.8 | 2.4 | 2.0 | Ca | 0.1 | 0 | 0 | 1050 | 18.6 |
| 34 | 0.8 | 2.4 | 2.0 | Ca | 0.2 | 0 | 0 | 1050 | 18.1 |
| 35* | 0.8 | 2.4 | 2.0 | Ca | 0.25 | 0 | 0 | 1050 | 8.9 |
| 36 | 0.8 | 2.4 | 2.0 | La | 0.1 | 0 | 0 | 1050 | 20.5 |
| 37* | 0.8 | 2.1 | 2.0 | — | 0 | 0.1 | 0 | 1150 | 9.3 |
| 38 | 0.8 | 2.2 | 2.0 | — | 0 | 0.1 | 0 | 1100 | 21.2 |
| 39 | 0.8 | 2.4 | 2.0 | — | 0 | 0.1 | 0 | 1050 | 20.7 |
| 40* | 0.8 | 2.5 | 2.0 | — | 0 | 0.1 | 0 | 1050 | 9.8 |
| 41* | 0.8 | 2.1 | 2.0 | — | 0 | 0.2 | 0 | 1050 | 9.1 |
| 42 | 0.8 | 2.2 | 2.0 | — | 0 | 0.2 | 0 | 1150 | 20.1 |
| 43 | 0.8 | 2.4 | 2.0 | — | 0 | 0.2 | 0 | 1050 | 19.4 |
| 44* | 0.8 | 2.5 | 2.0 | — | 0 | 0.2 | 0 | 1200 | 9.3 |
| 45* | 0.8 | 2.4 | 2.0 | — | 0 | 0.25 | 0 | 1050 | 6.7 |
| 46* | 0.8 | 2.1 | 2.0 | — | 0 | 0 | 1 | 1200 | 9.9 |
| 47 | 0.8 | 2.2 | 2.0 | — | 0 | 0 | 1 | 1100 | 19.7 |
| 48 | 0.8 | 2.4 | 2.0 | — | 0 | 0 | 1 | 1050 | 20.1 |
| 49* | 0.8 | 2.5 | 2.0 | — | 0 | 0 | 1 | 1050 | 9.5 |
| 50* | 0.8 | 2.1 | 2.0 | — | 0 | 0 | 1.5 | 1200 | 9.5 |
| 51 | 0.8 | 2.2 | 2.0 | — | 0 | 0 | 1.5 | 1050 | 18.2 |
| 52 | 0.8 | 2.4 | 2.0 | — | 0 | 0 | 1.5 | 1050 | 18.8 |
| 53* | 0.8 | 2.5 | 2.0 | — | 0 | 0 | 1.5 | 1150 | 9.6 |
| 54* | 0.8 | 2.1 | 2.0 | — | 0 | 0 | 1.6 | 1100 | 8.8 |

Note:
*in the Sample No. column indicates that the sample is out of the range of the present invention.

In Tables 1 and 2, $Q_{max}$ is the largest value obtained from samples having the same composition under various conditions (calcining temperature, firing temperature, and the temperature of an insulating oil and DC voltage during polarization). In addition, although $Q_{max}$ varies in accordance with the shape of sample, vibration mode, type of electrode and the like, when $Q_{max}$ obtained under the conditions performed in this embodiment is 10 or more, the sample can be considered at a level suitable for practical use.

As shown in Tables 1 and 2, $Q_{max}$ of all of the samples according to this example of the present invention is 10 or more, and hence, it is clearly understood that the samples are effective materials for forming piezoelectric ceramic devices, and particularly, for a piezoelectric ceramic oscillator and the like.

In addition, concerning the samples of this example according to the present invention, since the largest $Q_{max}$ was obtained for every sample at a temperature less than that for $SrBi_2Nb_2O_9$, a secondary effect of decreased firing temperature was confirmed. By decreasing the firing temperature, energy such as electrical power required for firing can be reduced, and the life of crucible or the like receiving piezoelectric ceramics during firing can be prolonged, whereby a reduction of manufacturing cost can be accomplished.

In addition, the piezoelectric ceramic compact of the present invention is not limited to the compositions of the example described above, and any type of piezoelectric ceramic compact within the scope of the present invention may be used.

In the example described above, $Q_{max}$ of the disk-shape vibrator in the thickness extensional vibration mode is described by way of example; however, the advantage of the present invention is not limited thereto, and in addition to the case of the thickness extensional vibration, the present invention can be effectively applied to other vibration modes, such as the shear vibration or thickness extensional vibration harmonic wave, used for piezoelectric ceramic devices, in particular, for a piezoelectric ceramic oscillator.

In a paper by T. Atsuki, et al., on a bismuth-based layered compound $SrBi_2Ta_2O_9$ as a thin-film material used for ferroelectric memories in Jpn. J. Appl. Pys., Vol. 34, Part 1, 9B, pp 5096–5099, it is reported that when the bismuth-based layered compound is modified to $Sr_{0.7}Bi_{2.4}Ta_2O_9$ or the like, the residual polarization is improved. However, the composition of the present invention is different from that disclosed in the paper described above. In addition, the object of the present invention is to provide an effective piezoelectric ceramic compact as a material for forming piezoelectric ceramic devices, and hence, the application field of the present invention differs from that of the compound described above. Furthermore, since the properties required for a material used for forming ferroelectric memories differ from those for a material used for forming piezoelectric ceramic devices, the present invention cannot be easily conceived from the research conducted by T Atsuki, et al.

Figure 2:
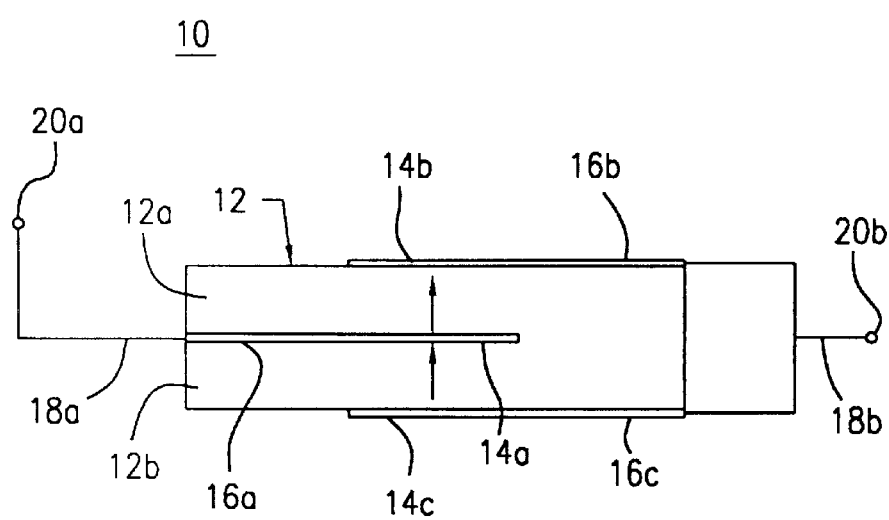
FIG. 2 is a cross-sectional view showing the piezoelectric ceramic vibrator shown in FIG. 1.

FIG. 1 is a perspective view showing an example of a piezoelectric ceramic vibrator of the present invention, and FIG. 2 is a cross-sectional view thereof. A piezoelectric ceramic vibrator 10 shown in FIGS. 1 and 2 comprises a piezoelectric ceramic compact 12 in the form of, for example, a rectangular parallelepiped. The piezoelectric ceramic compact 12 comprises two piezoelectric ceramic layers 12a and 12b. The piezoelectric ceramic layers 12a and 12b are formed of the piezoelectric ceramic compact described above according to the present invention and are formed so as to be integral with each other by laminating. In addition, the piezoelectric ceramic layers 12a and 12b are polarized in the same thickness direction as shown by the arrow in FIG. 2.

Between the piezoelectric ceramic layers 12a and 12b, a vibration electrode 14a in the form of, for example, a disk is provided at the central position of the piezoelectric ceramic compact 12 and a lead electrode 16a in the form of, for example, a T-shape is formed from the vibration electrode 14a to one edge surface of the piezoelectric ceramic compact 12. In addition, at the central portion of the surface of the piezoelectric ceramic layer 12a, a vibration electrode 14b in the form of, for example, a disk is formed and a lead electrode 16b in the form of, for example, a T-shape is formed from the vibration electrode 14b to the other edge surface of the piezoelectric ceramic compact 12. Furthermore, at the central portion of the surface of the piezoelectric ceramic layer 12b, a vibration electrode 14c in the form of, for example, a disk is formed and a lead electrode 16c in the form of, for example, a T-shape is formed from the vibration electrode 14c to the other edge surface of the piezoelectric ceramic compact 12.

Subsequently, the lead electrode 16a is connected to one external terminal 20a via a lead wire 18a, and the lead electrodes 16b and 16c are connected to the other external terminal 20b via another lead wire 18b.

In this connection, the present invention can be applied not only to an element structure as shown by the piezoelectric ceramic vibrator 10 described above and to the vibration mode excited thereby, but also to other piezoelectric ceramic devices, such as a piezoelectric ceramic vibrator, a piezoelectric ceramic filter and piezoelectric ceramic oscillator, using other element structures and other vibration modes (for example, shear vibration and a thickness extensional 3rd harmonic wave).

According to the present invention, a piezoelectric ceramic compact can be obtained as an effective material for forming a piezoelectric ceramic device and the like, which is primarily composed $SrBi_2Nb_2O_9$ containing no lead nor lead compounds or containing a little amount thereof and has a maximum value $Q_{max}$ improved to a level suitable for practical use.

What is claimed is:

1. A piezoelectric ceramic compact comprising a bismuth-based layered compound containing Sr, Bi, Nb and oxygen:
   wherein, when the molar ratio of Sr, Bi and Nb contained as primary components in the bismuth-based layered compound is represented by a:b:c, the relationships represented by $0.275 \leq a/c < 0.5$ and $4 \leq (2a+3b)/c \leq 4.5$ are satisfied.

2. A piezoelectric ceramic compact according to claim 1, wherein the piezoelectric ceramic compact further comprises from more than zero to 0.1 mol with respect to 1 mol of Nb of at least one divalent metal element other than Sr or trivalent metal element other than Bi.

3. A piezoelectric ceramic compact according to claim 2, wherein the divalent metal element other than Sr is at least one element selected from the group consisting of Mg, Ca, Ba and Pb.

4. A piezoelectric ceramic compact according to claim 2, wherein the trivalent metal element other than Bi is at least one element selected from the group consisting of Sc, Y, La, Ce, Pr, Nd, Sm, Gd, Dy, Er and Yb.

5. A piezoelectric ceramic compact according to claim 2, further containing a member of the group consisting of Nd, Ba, Ca and La.

6. A piezoelectric ceramic compact according to claim 5, wherein the amount of said member of the group is 0.025 to 0.05 mol per mol of Nb.

7. A piezoelectric ceramic compact according to claim 1, wherein the piezoelectric ceramic compact further comprises Ta in the range of from more than zero to less than about 0.25 mol with respect to 1 mol of Nb.

8. A piezoelectric ceramic compact according to claim 1, wherein the piezoelectric ceramic compact further comprises Mn in the range of from more than zero to about 1.5 percent by weight as $MnCO_3$.

9. A piezoelectric ceramic device comprising a piezoelectric ceramic compact according to claim 8, and an electrode associated with the piezoelectric ceramic compact.

10. A piezoelectric ceramic device comprising a piezoelectric ceramic compact according to claim 7, and an electrode associated with the piezoelectric ceramic compact.

11. A piezoelectric ceramic device comprising a piezo electric ceramic compact according to claim 6, and an electrode associated with the piezoelectric ceramic compact.

12. A piezoelectric ceramic device comprising a piezoelectric ceramic compact according to claim 5, and an electrode associated with the piezoelectric ceramic compact.

13. A piezoelectric ceramic device comprising a piezoelectric ceramic compact according to claim 4, and an electrode associated with the piezoelectric ceramic compact.

14. A piezoelectric ceramic device comprising a piezoelectric ceramic compact according to claim 3, and an electrode associated with the piezoelectric ceramic compact.

15. A piezoelectric ceramic device comprising a piezoelectric ceramic compact according to claim 2, and an electrode associated with the piezoelectric ceramic compact.

16. A piezoelectric ceramic device comprising a piezoelectric ceramic compact according to claim 1, and an electrode associated with the piezoelectric ceramic compact.

* * * * *